US009210822B2

(12) United States Patent
Crippa et al.

(10) Patent No.: US 9,210,822 B2
(45) Date of Patent: Dec. 8, 2015

(54) ENTRANCE DEVICE HOUSING WITH DETACHABLE FRONT PANEL

(71) Applicant: AmRoad Technology Inc, New Taipei (TW)

(72) Inventors: Mario Crippa, New Taipei (TW); Le-Rong Lin, Taipei (TW)

(73) Assignee: AmRoad Technology Inc. (TW)

( * ) Notice: Subject to any disclaimer, the term of this patent is extended or adjusted under 35 U.S.C. 154(b) by 366 days.

(21) Appl. No.: 13/737,082

(22) Filed: Jan. 9, 2013

(65) Prior Publication Data
US 2014/0055015 A1    Feb. 27, 2014

(30) Foreign Application Priority Data
Aug. 22, 2012   (TW) .............................. 101216108 U

(51) Int. Cl.
| | |
|---|---|
| *H05K 5/02* | (2006.01) |
| *H05K 5/06* | (2006.01) |
| *H02G 3/08* | (2006.01) |
| *H02G 3/14* | (2006.01) |

(52) U.S. Cl.
CPC .............. *H05K 5/061* (2013.01); *H02G 3/088* (2013.01); *H02G 3/14* (2013.01); *H05K 5/0247* (2013.01)

(58) Field of Classification Search
CPC ....... H02G 3/088; H02G 3/14; H05K 5/0247; H05K 5/061
USPC ....................................................... 174/50.54
See application file for complete search history.

(56) References Cited

U.S. PATENT DOCUMENTS

| | | | | |
|---|---|---|---|---|
| 5,363,436 | A * | 11/1994 | McMonagle, Jr. ... | G08B 25/006 379/355.01 |
| 7,535,716 | B2 * | 5/2009 | Fischer .................... | H04Q 1/10 165/80.3 |
| 2006/0037773 | A1 * | 2/2006 | Castaldo .................. | H02G 3/14 174/66 |
| 2011/0228083 | A1 * | 9/2011 | Su ........................ | H04M 1/0291 348/143 |
| 2012/0182382 | A1 * | 7/2012 | Serramalera ........... | H04N 7/147 348/14.07 |
| 2013/0032371 | A1 * | 2/2013 | Makino .................. | H02G 3/088 174/50 |

* cited by examiner

*Primary Examiner* — Chau N Nguyen
*Assistant Examiner* — Paul McGee, III

(57) ABSTRACT

The present invention relates to an entrance device housing with detachable front panel, mainly comprising: an accommodating body and a detachable front panel, in which the panel of the entrance device housing is detachable, so that the users are able to replace the panel of the entrance device by themselves as they like. Moreover, both the upper cover and the bottom box of the accommodating body include a plurality of water-guiding grooves, such that the water droplets onto the front surface and the rear surface of the accommodating body would be ruled out via the water-guiding grooves. Furthermore, a situation light accommodating structure is disposed on the detachable panel, and the light source in the situation light accommodating structure can emit light via the light-emitting surface during night, so as to facilitate the doorplate on the entrance wall show a beautiful and dreamy situation.

10 Claims, 10 Drawing Sheets

ENTRANCE DEVICE HOUSING WITH DETACHABLE FRONT PANEL

BACKGROUND OF THE INVENTION

1. Technical Field

The present invention relates to an entrance device, and more particular to an entrance device housing with detachable front panel.

2. Description of Related Art

Recently, with the rapid modernization of society, people make higher and higher demands on their living quality, and more particularly, on the comfort and the convenience of living environments thereof. So that, people upgrade the comfort and the convenience of their living environments by way of the advanced technologies, wherein the entrance guard machine is an example.

The initially developed entrance guard machine merely provides people to exchange their voice information, and then two people respectively stand inside and outside of the door can make conversation to each other through the entrance guard machine. After that, a video entrance guard machine is proposed, and then, through the video entrance guard machine, people can not only make conversation to each other, but also can see the images of the people in the conversation.

Please refer to FIG. 1, which illustrates a stereo view of a conventional video entrance guard machine. As shown in FIG. 1, the conventional video entrance guard machine 1' consists of a base 11' and a cover 12', wherein the base 11' and the cover 12' constitute an accommodating body 10' for accommodating a plurality of electronic chips, a plurality of electronic devices and a plurality of electronic circuit modules, and the cover 12' is assembled with the base 11' through a plurality of screws 18'.

So that, through above descriptions, it is able to know the conventional video entrance guard machine 1' has many advantages consisting of simple structure and full function; however, the video entrance guard machine 1' still includes the drawbacks and the shortcomings as follows:

1. The external water droplets may permeate into the accommodating body 10' through the seal between the base 11' and the cover 12', and result in the electronic components and circuit modules in the accommodating body 10' getting damp and damage.
2. The panel of the conventional video entrance guard machine 1' is not replaceable, it means that the conventional video entrance guard machine 1' includes a monotonous panel.

Accordingly, in view of the conventional video entrance guard machine still has shortcomings and drawbacks, the inventor of the present application has made great efforts to make inventive research thereon and eventually provided an entrance device housing with detachable front panel.

BRIEF SUMMARY OF THE INVENTION

The first objective of the present invention is to provide an entrance device housing with detachable front panel, in which an embedding protrusion is formed around the edge of the upper cover and an embedding recess is formed around the edge of the bottom box, therefore the embedding protrusion would be embedded with the embedding recess tightly and seamlessly when the upper cover is combined with the bottom box in order to constitute a accommodating body of the entrance device housing, such that the external water droplets cannot permeate into the accommodating body through the seal between the upper cover and the bottom box, and then the electronic components and circuit modules in the accommodating body are prevented from getting damp and damage.

The second objective of the present invention is to provide an entrance device housing with detachable front panel, in which the panel of the entrance device housing is detachable, so that the users are able to replace the panel of the entrance device by themselves as they like.

The third objective of the present invention is to provide an entrance device housing with detachable front panel, in which both the upper cover and the bottom box of the accommodating body include a plurality of water-guiding grooves; Thus when the rainwater (or the water droplets) fall onto the front surface and the rear surface of the accommodating body, the water droplets would be ruled out via the water-guiding grooves.

The fourth objective of the present invention is to provide an entrance device housing with detachable front panel, in which a situation light accommodating structure is disposed on the disposed on the top end of the front surface of the upper cover for accommodating a light source, and can be cleverly hided when the detachable panel is attached onto the upper cover; therefore, the light source in the situation light accommodating structure can emit light via the light-emitting surface during night, so as to illuminate the doorplate on the entrance wall for facilitating the doorplate show a beautiful and dreamy situation.

The fifth objective of the present invention is to provide an entrance device housing with detachable front panel, in which a plurality of adjusting posts and adjusting post disposing apertures are used for adjusting the distance between the rear surface of the bottom box and the inner surface of an outer cover according to different entrance forms, so as to facilitate the entrance device shown the most beautiful appearance thereof.

Accordingly, to achieve the above objectives of the present invention, the inventors propose an entrance device housing with detachable front panel, comprising: an accommodating body and a detachable front panel, wherein the accommodating body comprises:

an upper cover, having a plurality of water-guiding grooves and a plurality of panel combining holes on the front surface thereof, and the rear surface of the upper cover is formed with a combining opening; wherein an embedding protrusion is formed around the edge of the combining opening;

a situation light accommodating structure, disposed on the top end of the front surface of the upper cover for accommodating a light source, and having a light-emitting surface on the top end surface; and a bottom box, used for accommodating the necessary electronic components and circuit modules, and also provided with a plurality of water-guiding grooves on the rear surface thereof, moreover, an accommodating trough is formed on the front surface of the bottom box, and an embedding recess is formed around the edge of the accommodating trough; therefore the embedding protrusion would be embedded with the embedding recess tightly and seamlessly when the upper cover is combined with the bottom box in order to constitute the accommodating body, such that the external water droplets cannot permeate into the accommodating body through the seal between the upper cover and the bottom box.

Moreover, the detachable front panel is provided with a plurality of combining posts, wherein the combining posts are able to be inserted into the panel combining holes respectively for attaching the detachable front panel onto the front surface of the upper cover.

BRIEF DESCRIPTION OF THE SEVERAL VIEWS OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE INVENTION

To more clearly describe an entrance device housing with detachable front panel according to the present invention, embodiments of the present invention will be described in detail with reference to the attached drawings hereinafter.

Figure 1:
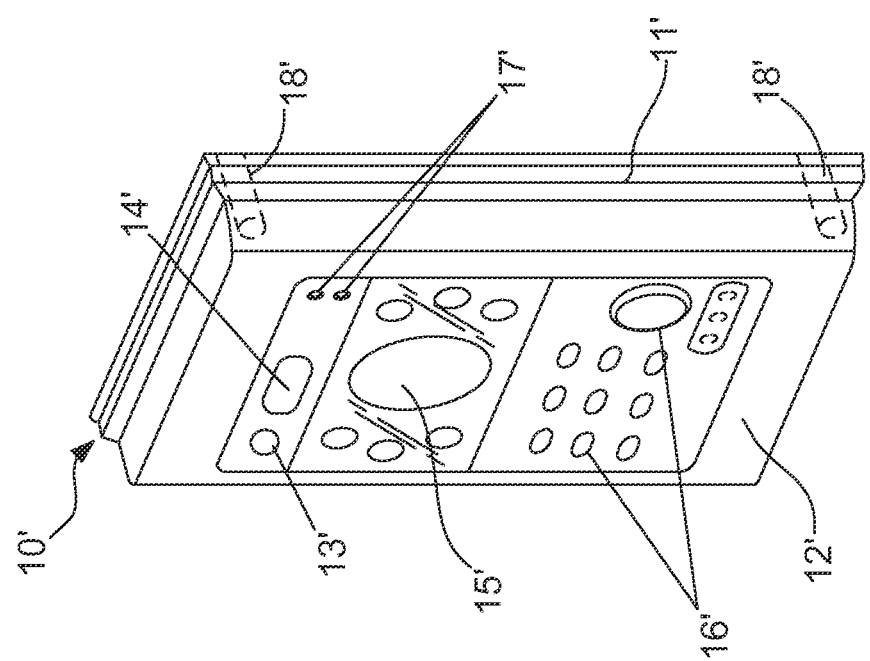
FIG. 1 is a stereo view of a conventional video entrance guard machine.
Figure 2:
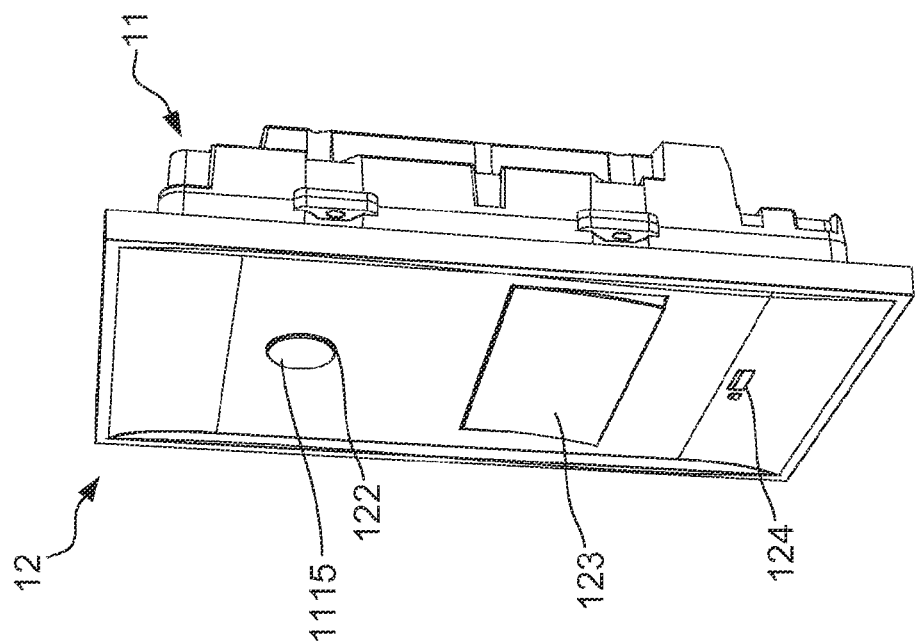
FIG. 2 is a stereo view of an entrance device housing with detachable front panel according to the present invention.
Figure 3:
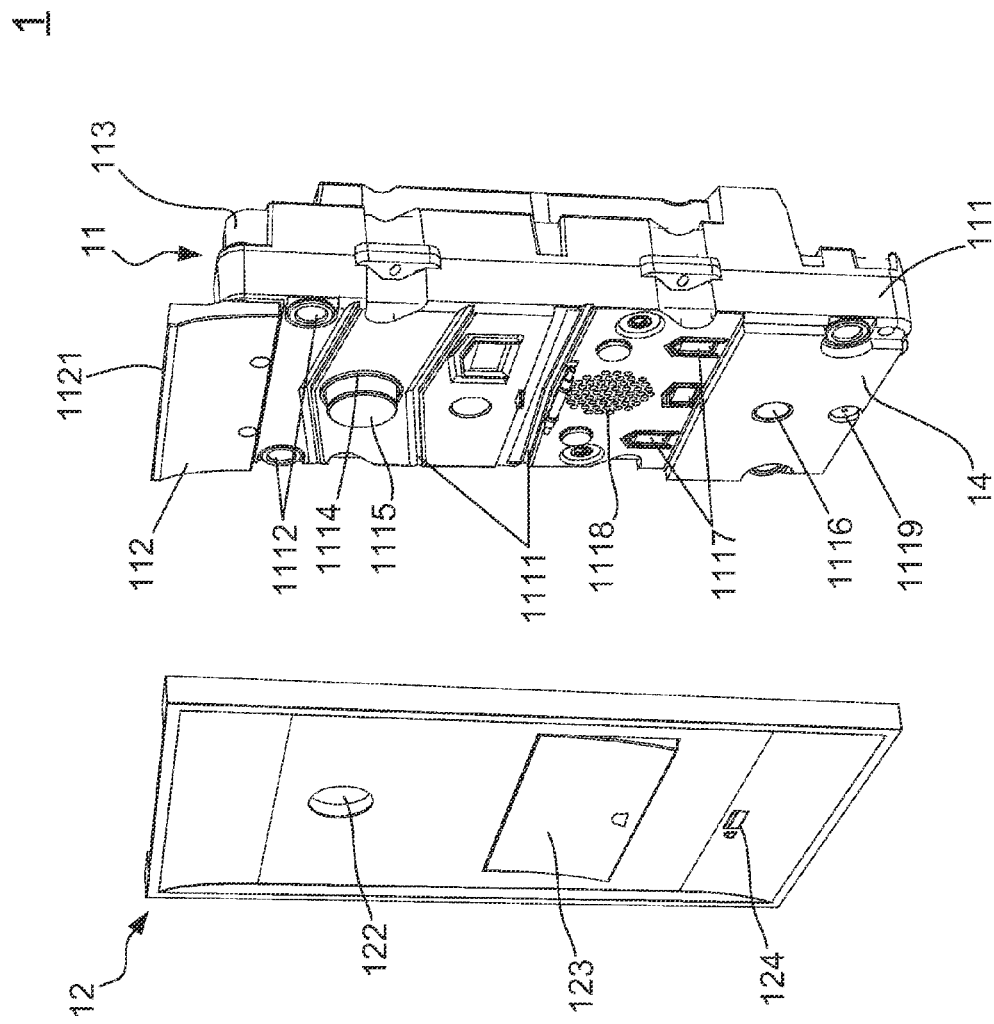
FIG. 3 is a partial exploded view of the entrance device housing with detachable front panel.

Please refer to FIG. 2 and FIG. 3, there are shown a stereo view and a partial exploded view of an entrance device housing with detachable front panel according to the present invention. As shown in FIG. 2 and FIG. 3, the entrance device housing with detachable front panel 1 mainly includes: an accommodating body 11 and a detachable front panel 12, wherein the accommodating body 11 consists of an upper cover 111, a bottom box 113 and a light accommodating structure 112.

Figures 4A, 4B:
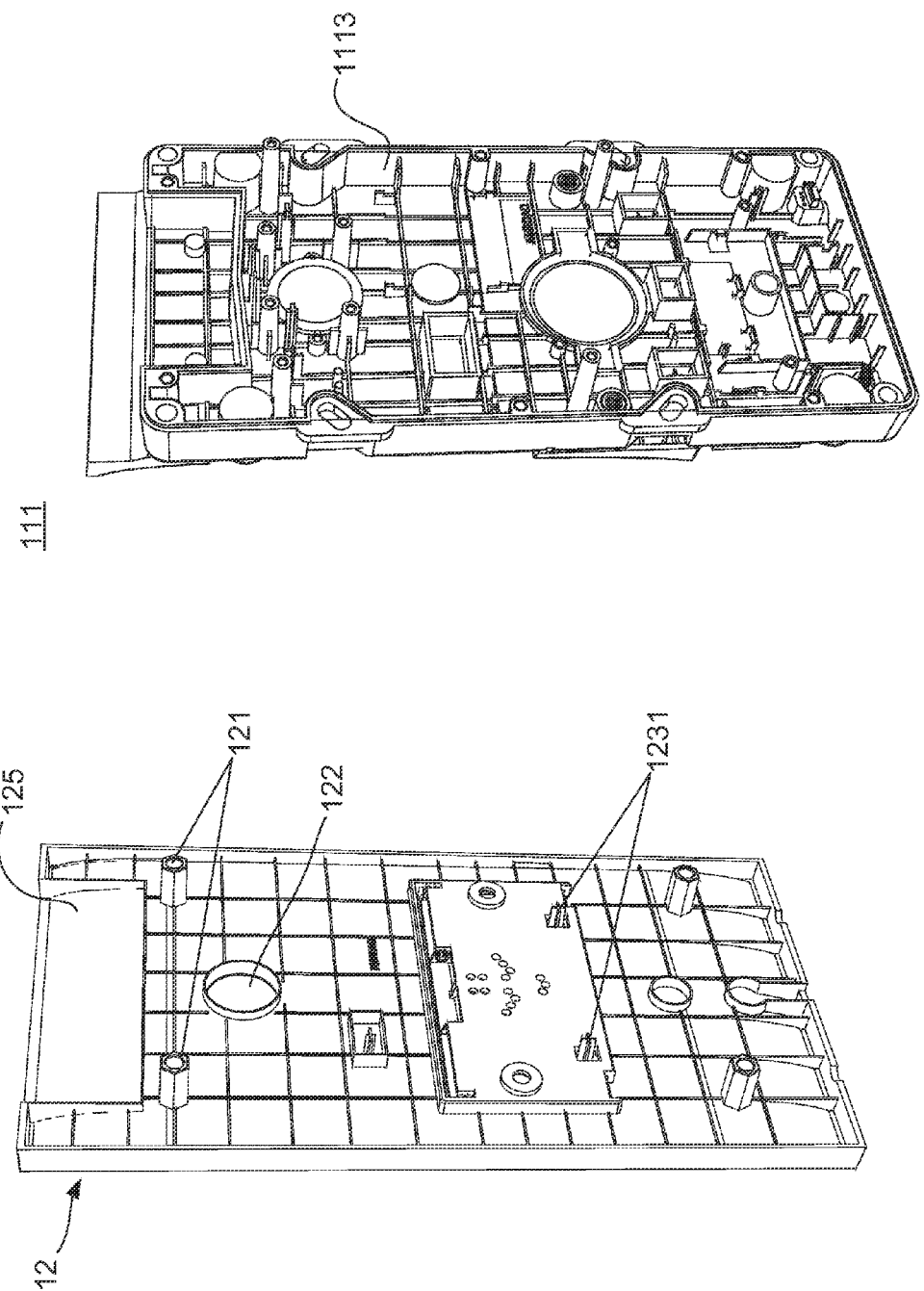
FIGS. 4A and 4B are stereo views of a detachable front panel.
Figure 5B:
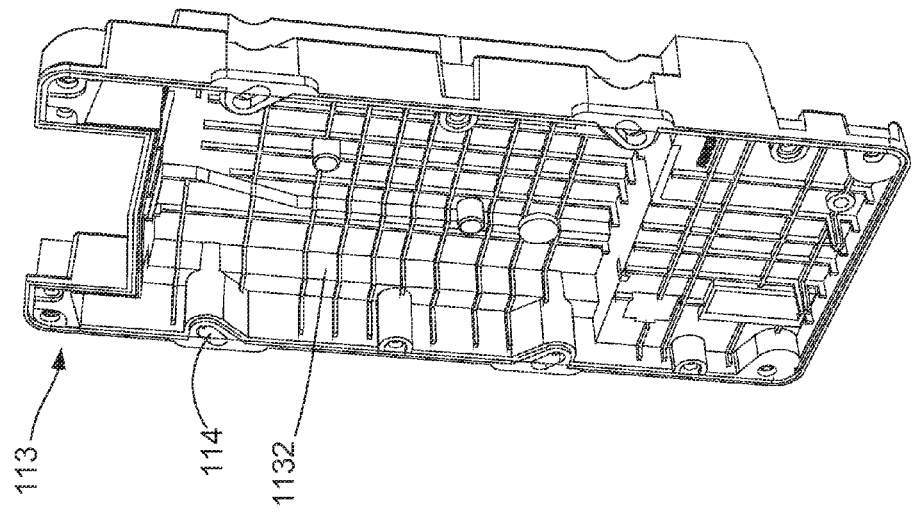
FIGS. 5A and 5B are stereo views of a bottom box.
Figure 5A:
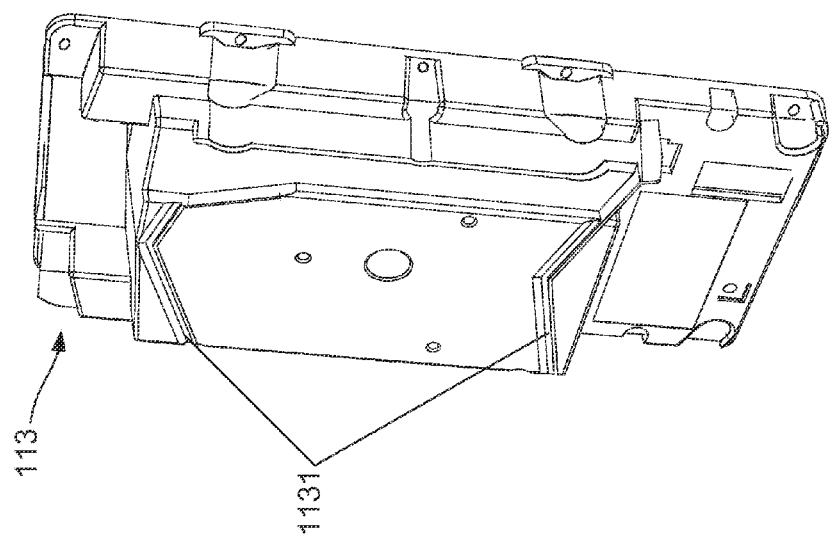
Figure 6A:
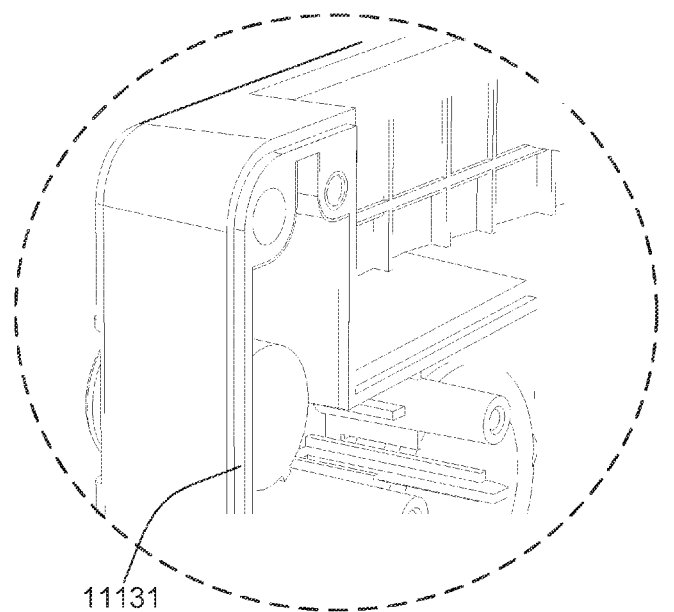
FIG. 6A is a zoom-in view of a portion structure of the upper cover.
Figure 6B:
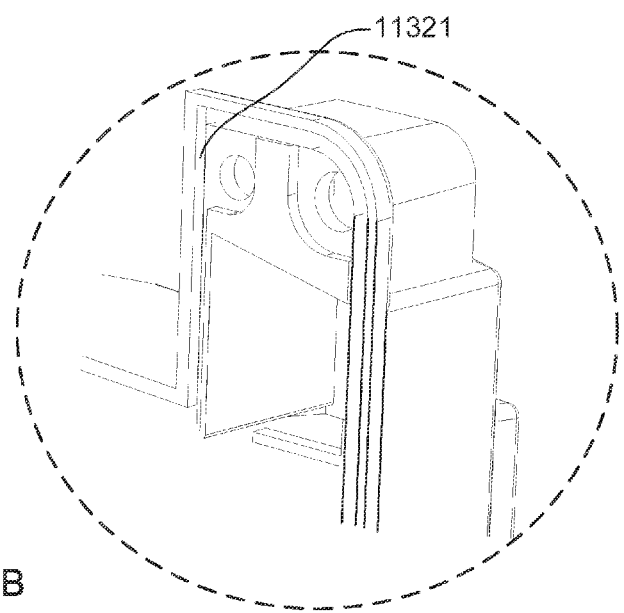
FIG. 6B is a zoom-in view of a portion structure of the bottom box.

Continuously refer to FIG. 2 and FIG. 3, and please simultaneously refer to FIG. 4A, FIG. 4B, FIG. 5A, FIG. 5B, FIG. 6A, and FIG. 6B, wherein the FIGS. 4A and 4B are stereo views of the detachable front panel 12, the FIGS. 5A and 5B are stereo views of the bottom box 113, the FIG. 6A is a zoom-in view of a portion structure of the upper cover 111, and the FIG. 6B is a zoom-in view of a portion structure of the bottom box 113.

As shown in FIGs., a plurality of water-guiding grooves 111 and panel combining holes 1112, a camera lens opening 1114, two doorbell trigger openings 1117, a plurality of audio-out holes 1118, a microphone opening 1119, and an indication light opening 1116 are formed on the front surface of the upper cover 111, and a combining opening 1113 is formed on the rear surface of the upper cover 111; moreover, an embedding protrusion 11131 is formed around the edge of the combining opening 1113.

The bottom box 113 has an accommodating trough 1132 on the front surface thereof, which is used for accommodating the necessary electronic components and circuit modules; in addition, the rear surface of the bottom box 113 is provided with a plurality of water-guiding grooves 1131. Corresponding to the embedding protrusion 11131, an embedding recess 11321 is formed around the edge of the accommodating trough 1132, therefore the embedding protrusion 11131 would be embedded with the embedding recess 11321 tightly and seamlessly when the upper cover 111 is combined with the bottom box 113 in order to constitute the accommodating body 11, such that the external water droplets cannot permeate into the accommodating body 11 through the seal between the upper cover 111 and the bottom box 113.

Opposite to the upper cover 111, the detachable front panel 12 includes a lens-protecting cover opening 122, a doorbell pressing member 123 and an indication pattern 124, and a plurality of combining posts 121 are disposed on the rear surface of the detachable front panel 12, used for being respectively inserted into the panel combining holes 1112 in order to attach the detachable front panel 12 onto the front surface of the upper cover 111. Moreover, because each of the panel combining holes 1112 are disposed with a rubber gasket, the combining post 121 is closely enclosed by the rubber gasket after being inserted into the panel combining hole 1112.

In the present invention, the camera lens opening 1114 of the upper cover 111 is used for exposing a camera lens, and covered by a lens-protecting cover 1115; and the lens-protecting cover opening 122 of the detachable panel 12 is used for exposing the lens-protecting cover 1115 opposite to the upper cover 111. As shown in FIGs., the two doorbell trigger openings 1117 of the upper cover 111 is used for exposing a doorbell trigger button (not shown), and opposite to the upper cover 111, a doorbell pressing member 123 of the detachable panel 12 includes two doorbell trigger posts 1231 on the rear surface thereof, wherein the doorbell can be trigger when the doorbell pressing member 123 is pressed for making the doorbell trigger posts 1231 push the doorbell trigger button.

Furthermore, in the upper cover 111, the audio-out holes 1118 are used for outputting the audio or voice from a horn, and the microphone opening 1119 is used for exposing a microphone. Particularly, in the present invention, a sound-absorbing foam 14 is disposed on the front surface of the upper cover 111 and locating between the audio-out holes 1118 and the microphone opening 1119, wherein the sound-absorbing foam 14 is used for absorbing a portion of audio and voice outputted from the audio-out holes 1118, so as to facilitate the microphone opening 1119 receive sound normally. Besides, the indication light opening 1116 of the upper cover 111 is used for exposing an access card indication light, and the indication pattern 124 of the detachable panel 12 is correspondent to the indication light 1116; Therefore, as shown in FIG. 3, the indication light would emit light for showing the indication pattern 124 when a user using an access card, so as to inform the user that the access card is normally induced.

Figure 7:
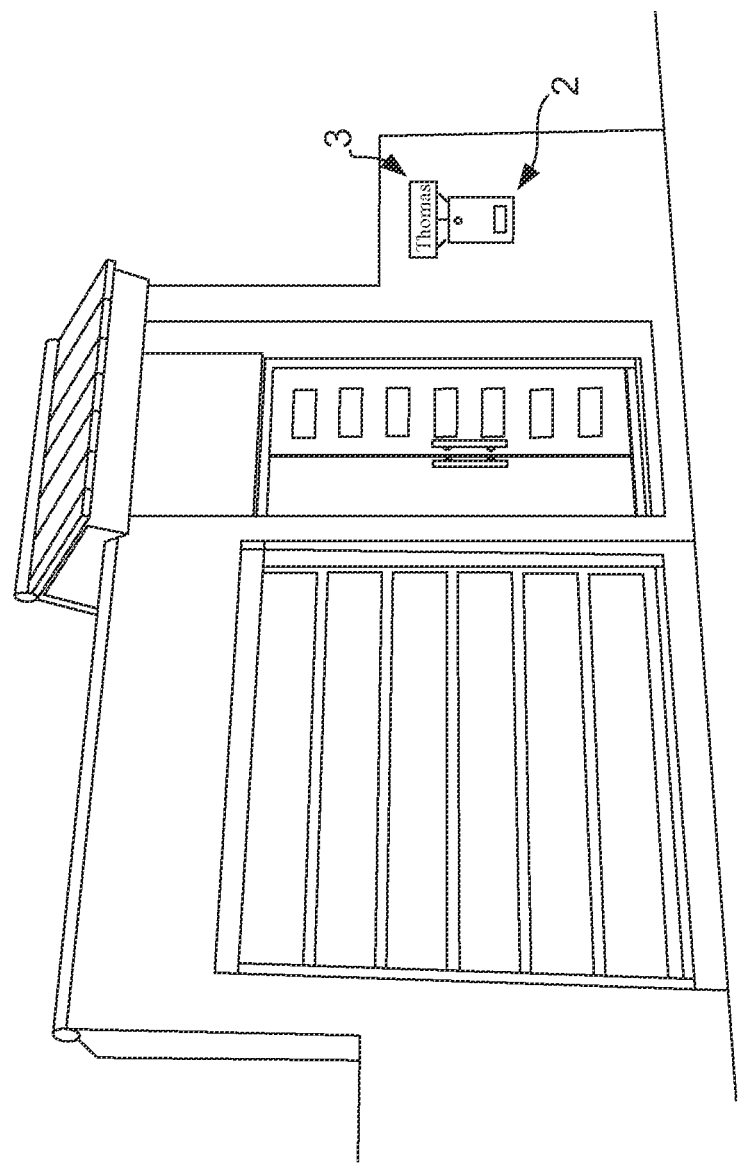
FIG. 7 is a schematic application view of the entrance device housing with detachable front panel according to the present invention.

The situation light accommodating structure 112 is a creative design in the present invention. As shown in FIGs., the situation light accommodating structure 112 is disposed on the disposed on the top end of the front surface of the upper cover 111 for accommodating a light source, and includes a light-emitting surface 1121 on the top end surface. Correspondingly, an arc concave surface 125 is formed on the top end of the rear surface of the detachable panel 12 for accommodating the situation light accommodating structure 112, such that the situation light accommodating structure 112 can be cleverly hided when the detachable panel 12 is attached onto the upper cover 111. So that, as shown in FIG. 7, when an entrance device 2 with detachable front panel is installed on an entrance wall, the light source in the situation light accommodating structure 112 can emit light via the light-emitting surface 1121 during night, so as to illuminate the doorplate 3 on the entrance wall for facilitating the doorplate 3 show a beautiful and dreamy situation.

It needs to be noted is that, as shown in FIG. 3 and FIG. 5A, when the rainwater (or the water droplets) fall onto the front surface and the rear surface of the accommodating body 11, the water droplets would be ruled out via the water-guiding grooves (1111, 1131). This drainage design is one of the important technology features in the entrance device housing with detachable front panel 1 of the present invention.

Figure 8:
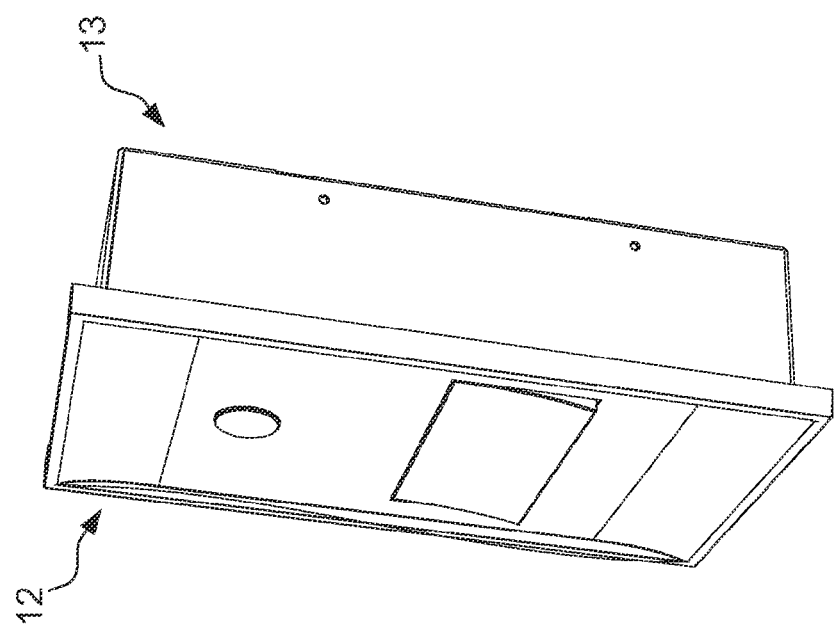
FIG. 8 is a second stereo view of the entrance device housing with detachable front panel.
Figure 9:
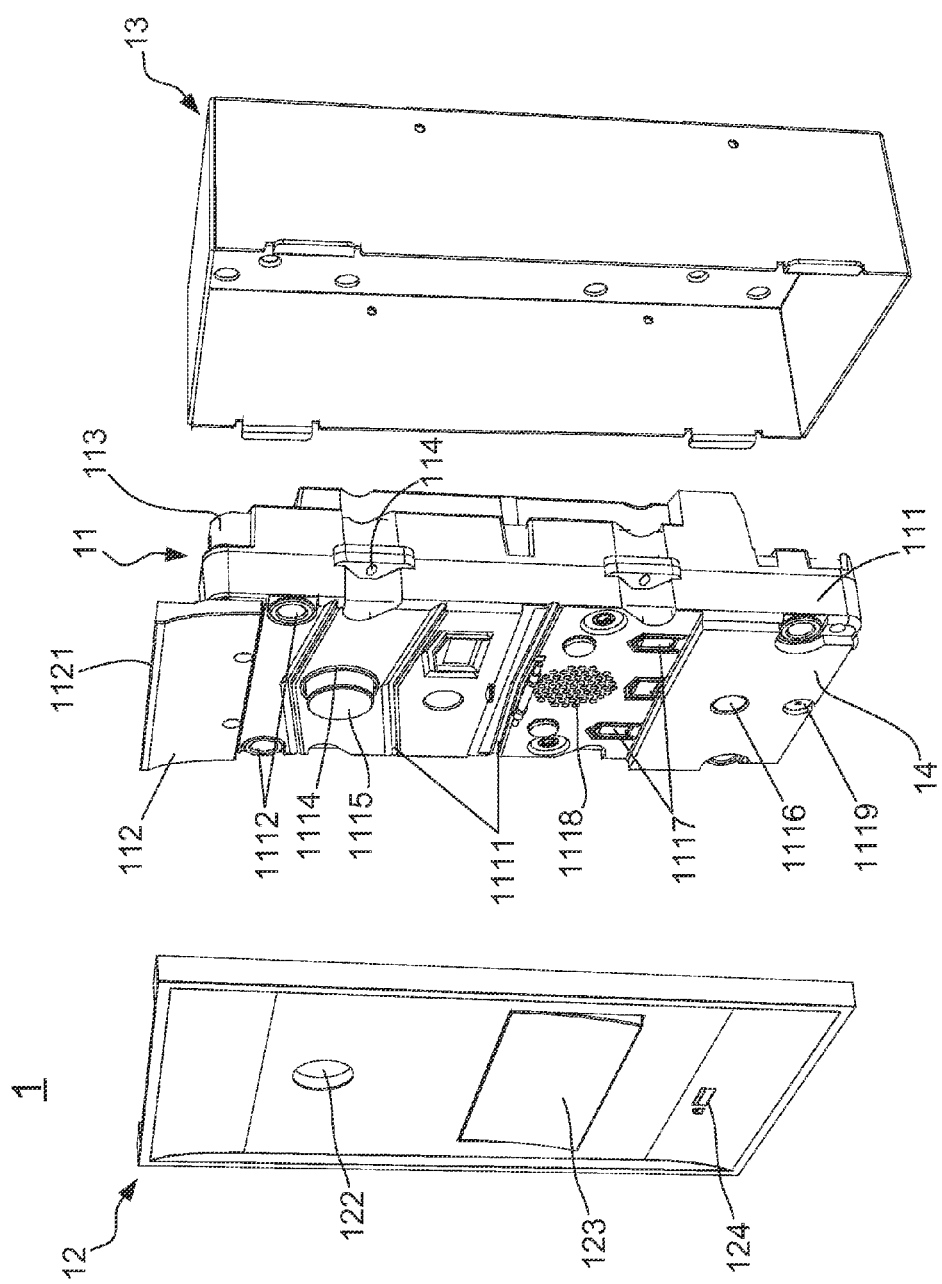
FIG. 9 is a second partial exploded view of the entrance device housing with detachable front panel.
Figure 10:
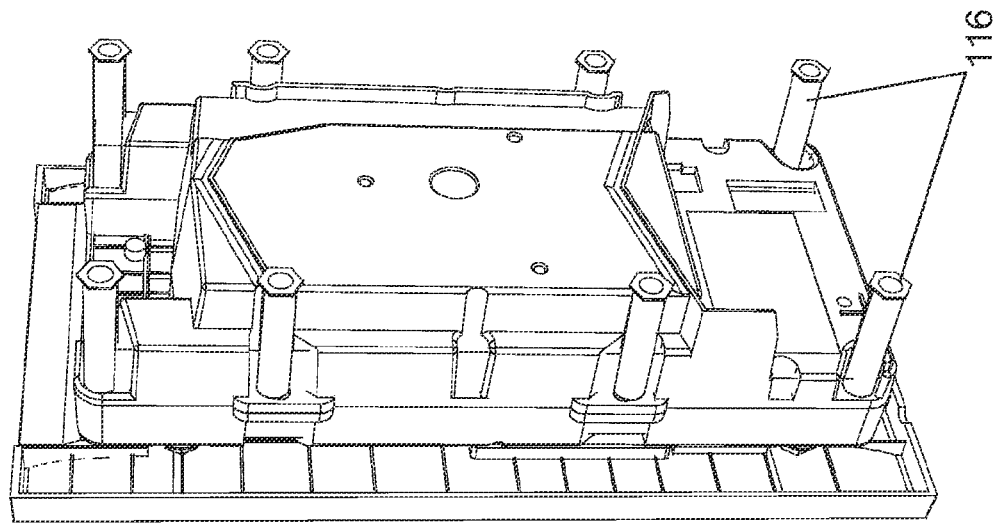
FIG. 10 is a third stereo view of the entrance device housing with detachable front panel.
Figure 10:
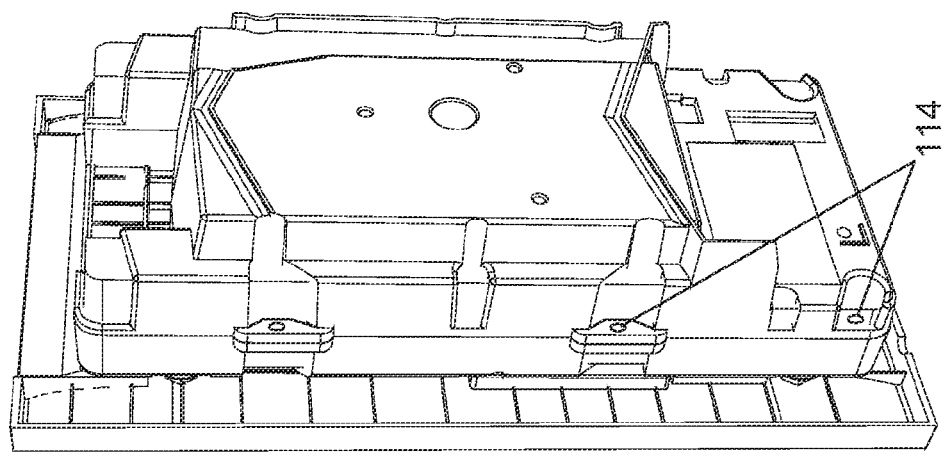

Continuously refer to FIG. 8 and FIG. 9, there are shown a second stereo view and a second partial exploded view of the entrance device housing with detachable front panel. As shown in FIG. 8 and FIG. 9, an outer cover 13 is further adopted for covering the accommodating body 11 in the present invention. Moreover, the accommodating body 11 further includes a plurality of a plurality of adjusting post disposing apertures 114, wherein and some adjusting post disposing apertures 114 are provided on the side edges of the accommodating body 11 by flange-ear form, and the other adjusting post disposing apertures 114 are disposed on the rear surface of the bottom box 113.

As shown in FIG. 8 and FIG. 9, the adjusting post disposing aperture 114 is oblong, capable of receiving an adjusting post 116; Thus, according to different entrance forms, the distance between the rear surface of the bottom box 113 and the inner surface of the outer cover 13 can be adjusted by using the adjusting posts 116, so as to facilitate the entrance device shown the most beautiful appearance thereof. In addition, because the adjusting post disposing aperture 114 is oblong, the adjusting posts 116 can also be used to adjust the installing angle of the accommodating body 11, so as to carry out a perfect installing situation for the entrance device.

Therefore, the above descriptions have been clearly and completely introduced the entrance device housing with detachable front panel of the present invention; in summary, the present invention has the following advantages:

1. In the entrance device housing with detachable front panel of the present invention, an embedding protrusion 11131 is formed around the edge of the combining opening 1113 and an embedding recess 11321 is formed around the edge of the accommodating trough 1132, therefore the embedding protrusion 11131 would be embedded with the embedding recess 11321 tightly and seamlessly when the upper cover 111 is combined with the bottom box 113 in order to constitute the accommodating body 11, such that the external water droplets cannot permeate into the accommodating body 11 through the seal between the upper cover 111 and the bottom box 113, and then the electronic components and circuit modules in the accommodating body 11 are prevented from getting damp and damage.
2. Moreover, in the present invention, because the panel of the entrance device housing is detachable, the users are able to replace the panel of the entrance device by themselves as they like.
3. Besides, when the rainwater (or the water droplets) fall onto the front surface and the rear surface of the accommodating body 11, the water droplets would be ruled out via the water-guiding grooves (1111, 1131). This drainage design is one of the important technology features in the entrance device housing with detachable front panel 1 of the present invention.
4. In addition, situation light accommodating structure 112 is a creative design in the present invention. In the present invention, the situation light accommodating structure 112 can be cleverly hided when the detachable panel 12 is attached onto the upper cover 111; therefore, when an entrance device 2 with detachable front panel is installed on an entrance wall, the light source in the situation light accommodating structure 112 can emit light via the light-emitting surface 1121 during night, so as to illuminate the doorplate 3 on the entrance wall for facilitating the doorplate 3 show a beautiful and dreamy situation.
5. Furthermore, by the using of the adjusting posts 116 and the adjusting post disposing apertures 114, the distance between the rear surface of the bottom box 113 and the inner surface of the outer cover 13 can be adjusted by using the adjusting posts 116 according to different entrance forms, so as to facilitate the entrance device shown the most beautiful appearance thereof. In addition, because the adjusting post disposing aperture 114 is oblong, the adjusting posts 116 can also be used to adjust the installing angle of the accommodating body 11, so as to carry out a perfect installing situation for the entrance device.

The above description is made on embodiments of the present invention. However, the embodiments are not intended to limit scope of the present invention, and all equivalent implementations or alterations within the spirit of the present invention still fall within the scope of the present invention.

We claim:

1. An entrance device housing with detachable front panel, comprising:
   an accommodating body, comprising:
      an upper cover, having a plurality of water-guiding grooves and a plurality of panel combining holes on the front surface thereof, and the rear surface of the upper cover being formed with a combining opening; wherein each of the water-guiding grooves is a V-groove and the water-guiding grooves are arranged in an inverted V pattern, and an embedding protrusion is formed around the edge of the combining opening;
      a situation light accommodating structure, being disposed on the top end of the front surface of the upper cover for accommodating a light source, and having a light-emitting surface on the top end surface; and
      a bottom box, being used for accommodating the necessary electronic components and circuit modules, and also provided with the plurality of water-guiding grooves on the rear surface thereof; an accommodating trough being formed on the front surface of the bottom box, and an embedding recess being formed around the edge of the accommodating trough; therefore the embedding protrusion would be embedded with the embedding recess tightly and seamlessly when the upper cover is combined with the bottom box in order to constitute the accommodating body, such that the external water droplets cannot permeate into the accommodating body through the seal between the upper cover and the bottom box; and
   a detachable front panel, being provided with a plurality of combining posts, wherein the combining posts are able to be inserted into the panel combining holes respectively for attaching the detachable front panel onto the front surface of the upper cover.

2. The entrance device housing with detachable front panel as described in claim 1, further comprising an outer cover, used for covering the accommodating body.

3. The entrance device housing with detachable front panel as described in claim 1, wherein the upper cover further comprising:

a camera lens opening, being formed on the front surface of the upper cover for exposing a camera lens, and covered by a lens-protecting cover;

at least one doorbell trigger opening, being used for exposing a doorbell trigger button;

a plurality of audio-out holes, being used for outputting the audio or voice from a horn;

a microphone opening, being used for exposing a microphone; and an indication light opening, being used for exposing an access card indication light.

4. The entrance device housing with detachable front panel as described in claim 3, wherein the detachable front panel further comprising:

a lens-protecting cover opening, being used for exposing the lens-protecting cover;

a doorbell pressing member, having at least one doorbell trigger post on the rear surface thereof, wherein the doorbell can be trigger when the doorbell pressing member is pressed for making the doorbell trigger post push the doorbell trigger button; and an indication pattern, being correspondent to the indication light, therefore the indication pattern would be showed when the indication light emitting light.

5. The entrance device housing with detachable front panel as described in claim 4, wherein a sound-absorbing foam is disposed on the front surface of the upper cover and locating between the audio-out holes and the microphone opening, used for absorbing a portion of audio and voice outputted from the audio-out holes, so as to facilitate the microphone opening receive sound normally.

6. The entrance device housing with detachable front panel as described in claim 4, wherein an arc concave surface is formed on the top end of the rear surface of the detachable panel for correspondingly accommodating the situation light accommodating structure.

7. The entrance device housing with detachable front panel as described in claim 1, wherein each of the panel combining holes are disposed with a rubber gasket.

8. The entrance device housing with detachable front panel as described in claim 2, wherein the accommodating body further comprising a plurality of adjusting post disposing apertures, and some adjusting post disposing apertures being provided on the side edges of the accommodating body by flange-ear form, and the other adjusting post disposing apertures being disposed on the rear surface of the bottom box.

9. The entrance device housing with detachable front panel as described in claim 8, wherein the adjusting post disposing aperture is oblong.

10. The entrance device housing with detachable front panel as described in claim 9, further comprising a plurality of adjusting posts, which are able to be respectively inserted into the adjusting post disposing apertures, and used for adjusting the distance between the rear surface of the bottom box and the inner surface of the outer cover, moreover, the adjusting posts also be used to adjust the installing angle of the accommodating body.

\* \* \* \* \*